(12) United States Patent
Smick et al.

(10) Patent No.: US 8,227,768 B2
(45) Date of Patent: *Jul. 24, 2012

(54) LOW-INERTIA MULTI-AXIS MULTI-DIRECTIONAL MECHANICALLY SCANNED ION IMPLANTATION SYSTEM

(75) Inventors: Theodore Smick, Essex, MA (US); Geoffrey Ryding, Manchester, MA (US); Ronald F. Horner, Auburndale, MA (US); Paul Eide, Stratham, NH (US); Marvin Farley, Ipswich, MA (US); Kan Ota, Bedford, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 546 days.

This patent is subject to a terminal disclaimer.

(21) Appl. No.: 12/487,229

(22) Filed: Jun. 18, 2009

(65) Prior Publication Data
US 2009/0321631 A1  Dec. 31, 2009

Related U.S. Application Data

(60) Provisional application No. 61/075,614, filed on Jun. 25, 2008.

(51) Int. Cl.
*G21K 5/04* (2006.01)
(52) U.S. Cl. ............... 250/491.1; 250/492.1; 250/492.2; 250/492.3
(58) Field of Classification Search ............... 250/491.1, 250/492.1, 492.22, 492.3
See application file for complete search history.

(56) References Cited

U.S. PATENT DOCUMENTS

| 4,976,582 | A | 12/1990 | Clavel |
| 5,179,525 | A | 1/1993 | Griffis et al. |
| 6,240,799 | B1 | 6/2001 | Yau |
| 6,581,437 | B2 | 6/2003 | Chrystall et al. |
| 6,729,202 | B2 | 5/2004 | Gosselin et al. |
| 7,124,660 | B2 | 10/2006 | Chiang |
| 2005/0173655 | A1* | 8/2005 | Naylor-Smith et al. . 250/492.21 |
| 2005/0191409 | A1* | 9/2005 | Murrell et al. ..................... 427/8 |
| 2006/0076108 | A1* | 4/2006 | Holland et al. .......... 156/345.27 |
| 2006/0087639 | A1* | 4/2006 | Puerto et al. .................... 355/75 |

(Continued)

OTHER PUBLICATIONS

Stewart Platform From Wikipedia, the free encyclopedia, printed from the Internet at: http://en.wikipedia.org/wiki/Stewart_platform, Jun. 11, 2008, 2 pgs.

(Continued)

*Primary Examiner* — David A Vanore
*Assistant Examiner* — Nicole Ippolito
(74) *Attorney, Agent, or Firm* — Eschweiler & Associates, LLC (57) ABSTRACT

An ion implantation system configured to produce an ion beam is provided, wherein an end station has a robotic architecture having at least four degrees of freedom. An end effector operatively coupled to the robotic architecture selectively grips and translates a workpiece through the ion beam. The robotic architecture has a plurality of motors operatively coupled to the end station, each having a rotational shaft. At least a portion of each rotational shaft generally resides within the end station, and each of the plurality of motors has a linkage assembly respectively associated therewith, wherein each linkage assembly respectively has a crank arm and a strut. The crank arm of each linkage assembly is fixedly coupled to the respective rotational shaft, and the strut of each linkage assembly is pivotally coupled to the respective crank arm at a first joint, and pivotally coupled to the end effector at a second joint.

35 Claims, 10 Drawing Sheets

U.S. PATENT DOCUMENTS

| | | | |
|---|---|---|---|
| 2006/0238133 A1* | 10/2006 | Horsky et al. | 315/111.81 |
| 2007/0138374 A1* | 6/2007 | Nishibashi et al. | 250/208.1 |
| 2007/0262267 A1* | 11/2007 | Freytsis et al. | 250/491.1 |
| 2007/0279768 A1* | 12/2007 | Shibazaki | 359/811 |
| 2008/0142726 A1* | 6/2008 | Relleen et al. | 250/400 |
| 2008/0142728 A1* | 6/2008 | Smick et al. | 250/400 |
| 2009/0173894 A1* | 7/2009 | Alcott et al. | 250/492.21 |
| 2009/0206270 A1* | 8/2009 | Glayish et al. | 250/396 ML |

OTHER PUBLICATIONS

Delta robot From Wikipedia, the free encyclopedia, printed from the Internet at: http://en.wikipedia.org/wiki/Delta_robot, Jun. 13, 2008, 2 pgs.

* cited by examiner

LOW-INERTIA MULTI-AXIS MULTI-DIRECTIONAL MECHANICALLY SCANNED ION IMPLANTATION SYSTEM

REFERENCE TO RELATED APPLICATION

This application claims priority to and the benefit of U.S. Provisional Application Ser. No. 61/075,614 which was filed Jun. 25, 2008, entitled, LOW-INERTIA MULTI-AXIS MULTI-DIRECTIONAL MECHANICALLY SCANNED ION IMPLANTATION SYSTEM, the entirety of which is hereby incorporated by reference as if fully set forth herein.

FIELD OF THE INVENTION

The present invention relates generally to ion implantation systems, and more specifically to systems and methods scanning a workpiece in an ion implantation system.

BACKGROUND OF THE INVENTION

In the manufacture of semiconductor devices and other products, ion implantation systems are used to impart impurities, known as dopant elements, into semiconductor workpieces, display panels, or other workpieces. Conventional ion implantation systems or ion implanters treat a workpiece with an ion beam in order to produce n- or p-type doped regions, or to form passivation layers in the workpiece. When used for doping semiconductors, the ion implantation system injects a selected ion species to produce the desired extrinsic material. For example, implanting ions generated from source materials such as antimony, arsenic, or phosphorus results in n-type extrinsic material workpieces. Alternatively, implanting ions generated from materials such as boron, gallium, or indium creates p-type extrinsic material portions in a semiconductor workpiece.

Conventional ion implantation systems include an ion source that ionizes a desired dopant element which is then accelerated to form an ion beam of prescribed energy. The ion beam is directed at a surface of the workpiece to implant the workpiece with the dopant element. The energetic ions of the ion beam penetrate the surface of the workpiece so that they are embedded into the crystalline lattice of the workpiece material to form a region of desired conductivity. The implantation process is typically performed in a high vacuum process chamber which prevents dispersion of the ion beam by collisions with residual gas molecules and which minimizes the risk of contamination of the workpiece by airborne particulates.

Conventionally, ion implantation processes are performed in either a batch process, wherein multiple substrates are processed simultaneously, or in a serial process, wherein a single substrate is individually processed. Traditional high-energy or high-current batch ion implanters, for example, are operable to achieve a short ion beam line, wherein a large number of workpieces may be placed on a wheel or disk, and the wheel is simultaneously spun and radially translated through the ion beam, thus exposing all of the substrates surface area to the beam at various times throughout the process. Processing batches of substrates in such a manner, however, generally makes the ion implanter substantially large in size.

In a typical serial process, on the other hand, an ion beam is either scanned in a single axis across a stationary workpiece, or the workpiece is translated in one direction past a fan-shaped, or scanned ion beam. The process of scanning or shaping a uniform ion beam, however, generally requires a complex and/or long beam line, which is generally undesirable at low energies. Furthermore, a uniform translation and/or rotation of either the ion beam or the workpiece is generally required in order to provide a uniform ion implantation across the workpiece. However, such a uniform translation and/or rotation can be difficult to achieve, due, at least in part, to substantial inertial forces associated with moving the conventional devices and scan mechanisms during processing.

Therefore, a need exists for a device for scanning an ion beam across a substrate, wherein the substrate is uniformly translated and/or rotated with respect to the ion beam, wherein the device has a relatively low inertia associated therewith.

SUMMARY OF THE INVENTION

The present invention overcomes the limitations of the prior art by providing an apparatus, system, and method for scanning a workpiece in ion implantation system. Consequently, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is directed generally toward an ion implantation system for implanting ions into one or more workpieces, wherein inertial forces are minimized during a translation of the one or more workpieces through the ion beam. In one example, the ion implantation system comprises an ion source configured to form an ion beam, and a mass analyzer configured to mass analyze the ion beam. An end station is further provided, wherein the end station comprises a robotic architecture having at least four degrees of freedom. Preferably, the robotic architecture has 6 degrees of freedom. An end effector is further operatively coupled to the robotic architecture and configured to selectively grip the one or more workpieces, wherein the robotic architecture is configured to selectively translate and/or rotate the workpiece through the ion beam in order to achieve desired implant specifications.

In accordance with one exemplary aspect, the robotic architecture comprises a plurality of motors operatively coupled to the end station, wherein each of the plurality of motors has a rotational shaft associated therewith. At least a portion of each rotational shaft generally resides within the end station, wherein each of the plurality of motors has a linkage assembly further respectively associated therewith. Each linkage assembly, for example, respectively comprises a crank arm and a strut, wherein the crank arm of each linkage assembly is fixedly coupled to the respective rotational shaft. The strut of each linkage assembly is further pivotally coupled to the respective crank arm at a respective first joint, wherein each strut is further pivotally coupled to the end effector at a second joint.

In one example, the plurality of motors comprises six servo motors respectively operatively coupled to six linkage assemblies, therein providing six degrees of freedom of movement of the end effector. The end effector, for example, comprises three pivot points, wherein two struts are pivotally coupled to each pivot point, therein defining three pairs or servo motors and linkage assemblies that are associated the three respective pivot points of the end effector. In one example, the end effector comprises three spokes emanating from a central structure, and wherein the three pivot points are generally defined at an end of each spoke. For example, two of the three spokes are generally perpendicular to one another, wherein a long-slit faraday is respectively coupled to each of the two of the three spokes that are generally perpendicular to one another, wherein the long-slit faradays are operable determine one more characteristics of the ion beam.

In another example, the plurality of spokes emanate from a central structure, and an arcuate structure is further provided generally surrounding the central structure, wherein the three pivot points are generally defined along the arcuate structure. The arcuate structure may comprise an enclosed ring or an open arc.

In accordance with another aspect, one or more electrostatic chucks are further provided, wherein the end effector comprises a central structure configured to selectively engage and disengage each of the one or more electrostatic chucks. The ion implantation system, for example, further comprises an electrostatic chuck base station, wherein the one more electrostatic chucks are configured to be heated and/or cooled at the electrostatic chuck base station, and wherein the central structure is configured to selectively engage and disengage each of the electrostatic chucks at the electrostatic chuck base station. One or more portable faradays may be further provided, wherein the central structure is further configured to selectively engage and disengage the one or more portable faradays from the electrostatic chuck base station for selective translation through the ion beam.

According to another aspect, the central structure further comprises a pivot apparatus, wherein the pivot apparatus is configured to selectively rotate the one or more electrostatic chucks in one or more axes with respect to the central structure. The three pivot points described above, for example, generally define a plane of the central structure, and wherein the pivot apparatus is configured to rotate each of the one or more electrostatic chucks along an axis that is generally parallel and/or perpendicular to the plane of the central structure.

According to another exemplary aspect of the invention, the end station further comprises a generally hollow cylindrical beam dump positioned along a path of the ion beam generally downstream of the workpiece, wherein the beam dump is configured to generally confine particulate contamination to within the beam dump. The beam dump, for example, comprises a substantially long cylindrical faraday.

In accordance with another aspect, the ion implantation system further comprises a controller configured to control the ion source, mass analyzer, and end station, wherein the workpiece is scanned through the ion beam in a predetermined manner. For example, the controller is configured to control the plurality of motors based on feedback from the plurality of encoders, wherein one or more of the electrostatic chuck, the workpiece, the slot faraday, and portable faraday may be scanned through the ion beam.

In accordance with yet another aspect, a method for implanting ions into a workpiece is provided, wherein an ion beam and a workpiece scanning system is provided. The workpiece scanning system, for example, comprises the robotic architecture described above. The workpiece is gripped via the end effector, and a spatial position and orientation of the end effector and workpiece with respect to the ion beam is controlled via a control of the plurality of motors. Thus, the workpiece can be scanned through the ion beam along a predetermined scan path. Furthermore, the workpiece can be picked up and/or dropped off from a workpiece transfer point via the control. In another example, one or more electrostatic chucks and/or a portable faraday can be selectively picked up and/or dropped off at the base station described above via the control. A temperature of the one or more electrostatic chucks can be further controlled, wherein an exchange of electrostatic chucks advantageously increases throughput and/or processing of the workpieces. The end effector can be further selectively scanned through the ion beam for profiling via selective translation of the above-described slot faraday(s). According to another example, the control of the plurality of motors described above is based on feedback from the plurality of encoders.

The predetermined scan path, for example, comprises a plurality of generally polygonal scans of the ion beam when viewed from the plane of the workpiece. For example, a plurality of generally octagonal scans of the ion beam can be made when viewed from the plane of the workpiece. Alternatively, or in combination, the predetermined scan path can also comprise one or more of a plurality of vector, raster, and circular or arcuate scans of the ion beam when viewed from the plane of the workpiece.

The method, in accordance with another aspect of the invention, further comprises providing a plurality of electrostatic chucks, wherein each of the plurality of electrostatic chucks are operable to selectively grip the workpiece, and wherein the end effector comprises a central structure associated with the plurality of electrostatic chucks. One of the plurality electrostatic chucks is selectively engaged via the central structure. The workpiece, for example, can further be selectively engaged via the one of the plurality of electrostatic chucks, wherein the engagement of the workpiece can occur before, during, or after the engagement between the central structure and the electrostatic chuck.

According to another example, the method further comprises heating and/or cooling the plurality of electrostatic chucks at the above-mentioned electrostatic chuck base station, wherein the central structure is configured to selectively engage and disengage one of the plurality of electrostatic chucks at the electrostatic chuck base station based on one or more of a desired processing temperature and a condition of each of the plurality of electrostatic chucks. The condition of each of the plurality of electrostatic chucks, for example, comprises a temperature of each of the plurality of electrostatic chucks.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The present invention is directed generally towards an apparatus, system, and method for implanting ions into a workpiece via an ion beam. More particularly, the system provides a low-inertia workpiece scanning apparatus for scanning and workpiece handling, as well as characterizing the ion beam. Accordingly, the present invention will now be described with reference to the drawings, wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details.

Figure 1:
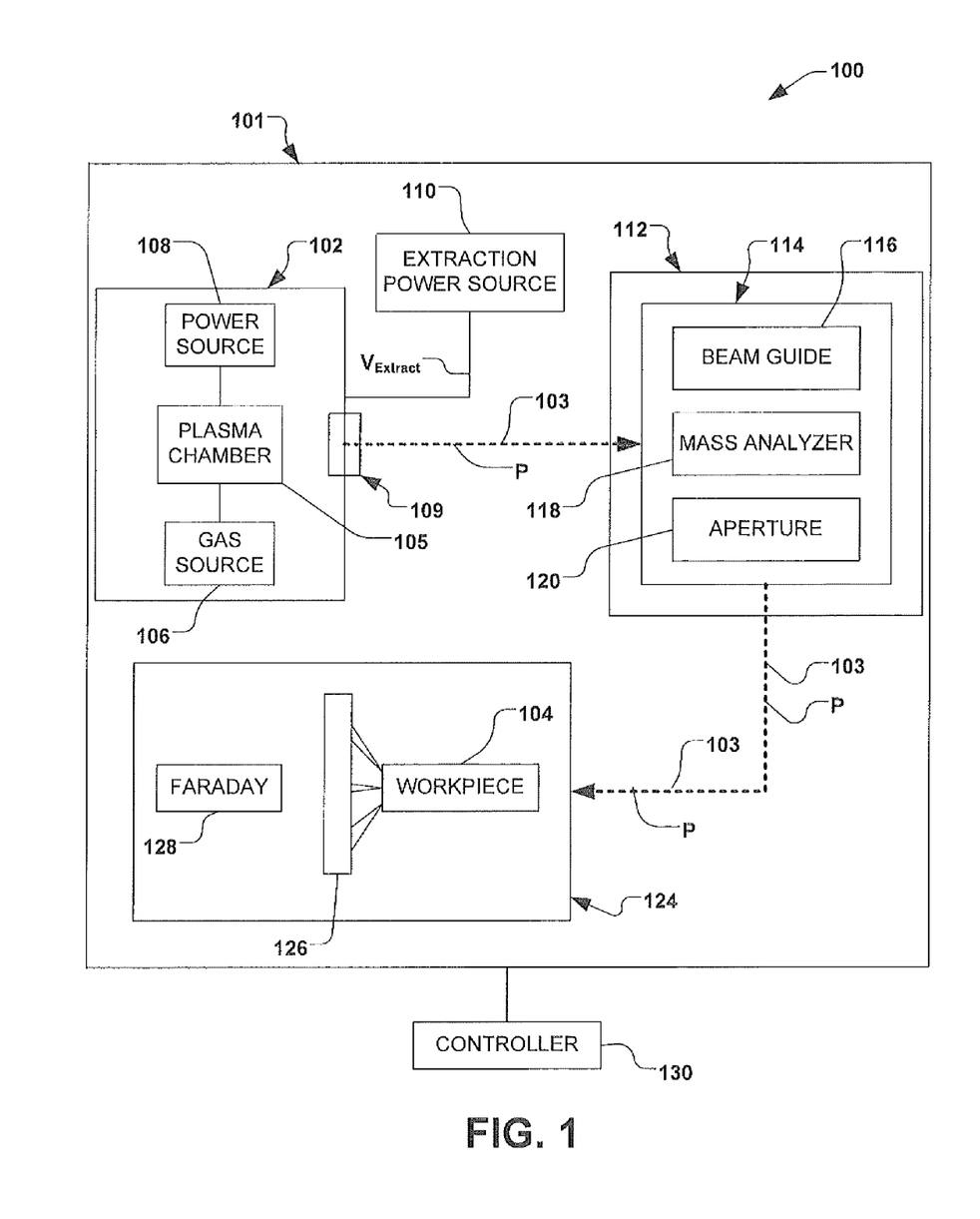
FIG. 1 is a system-level block diagram of an exemplary ion implantation system according to one aspect of the present invention.

In order to gain a better understanding of the invention, FIG. 1 illustrates an exemplary ion implantation system 100 depicted in block diagram form, wherein the exemplary ion implantation system is suitable for implementing one or more aspects of the present invention. The system 100 comprises an ion implantation apparatus 101 comprising an ion source 102 for producing a quantity of ions operable to travel along an ion beam path P, thus defining an ion beam 103 for implantation of the ions into a workpiece 104 (e.g., a semiconductor workpiece, display panel, etc.). The ion source 102, for example, generally comprises a plasma chamber 105, a process gas source 106, and a power source 108, wherein positively charged ions are generated from the process gas within the plasma chamber by an application of power from the power source. The process gas source 106 may comprise a source material such as an ionizable gas or vaporized solid source material or species that has been previously vaporized. For an n-type implantation into the workpiece 104, for example, the source materials may comprise boron, gallium or indium. For a p-type implantation, for example, the source materials may comprise arsenic, phosphorus, or antimony.

The ion source 102 further comprises an extraction assembly 109 associated therewith, wherein charged ions are extracted from the ion source upon an application of an extraction voltage $V_{Extract}$ thereto. An extraction power source 110 is operable to provide the extraction voltage $V_{Extract}$, wherein the extraction voltage may be further modulated. A beamline assembly 112 is further provided downstream of the ion source 102, wherein the beamline assembly generally receives the charged ions. The beamline assembly 112, for example, comprises one or more components 114, such as a beamguide 116, a mass analyzer 118, and an aperture 120, wherein the one or more components are operable to form and shape the ion beam 103.

The mass analyzer 118, for example, further comprises a field generating component, such as a magnet (not shown), wherein the mass analyzer generally provides a magnetic field across the ion beam 103, thus deflecting ions from the ion beam at varying trajectories according to a charge-to-mass ratio of the ions. For example, ions traveling through the magnetic field experience a force that directs individual ions of a desired charge to mass ratio along the beam path P and deflects ions of undesired charge to mass ratios away from the beam path. Once through the mass analyzer 118, the ion beam 103 is directed though the aperture 120, wherein the ion beam is generally limited to produce a concise beam for implantation into the workpiece 104.

The ion implantation system 100 further comprises an end station 124, wherein the workpiece 104 generally resides. In the manufacture of integrated circuit devices, display panels, and other products, it is generally desirable to uniformly implant dopant species across the entire surface of the workpiece 104. The ion implantation apparatus 101, for example, is configured to implant ions into a single workpiece 104 (e.g., a "serial" ion implanter), wherein the workpiece generally resides on a pedestal or chuck (not shown) situated within the end station 124 on a robotic architecture 126, as will be described infra. The robotic architecture is configured to translate the workpiece 104 through the ion beam 103 in a predetermined manner. It should be noted that any ion implantation apparatus operable to extract ions from an ion source and implant them into one or more workpieces is contemplated as falling within the scope of the present invention.

The ion implantation apparatus 101, in one example, further comprises a deep faraday 128 generally situated along the path P of the ion beam 103 at a position downstream of the workpiece 104. In one example, the deep faraday 128 generally resides within the end station and comprises a substantially hollow member. The deep faraday 128, for example, is operable to generally confine the ion beam 103 therein, therein generally minimizing particle contamination within the end station 124. For example, deep faraday 128 is configured to generally entrap or confine the ion beam 103 when no workpiece 104 is present along the path P of the ion beam 103 The deep faraday 128 may serve one or more purposes, such as to substantially confine the ion beam 103 and/or to provide a measurement component for analyzing the ion beam.

Figure 2:
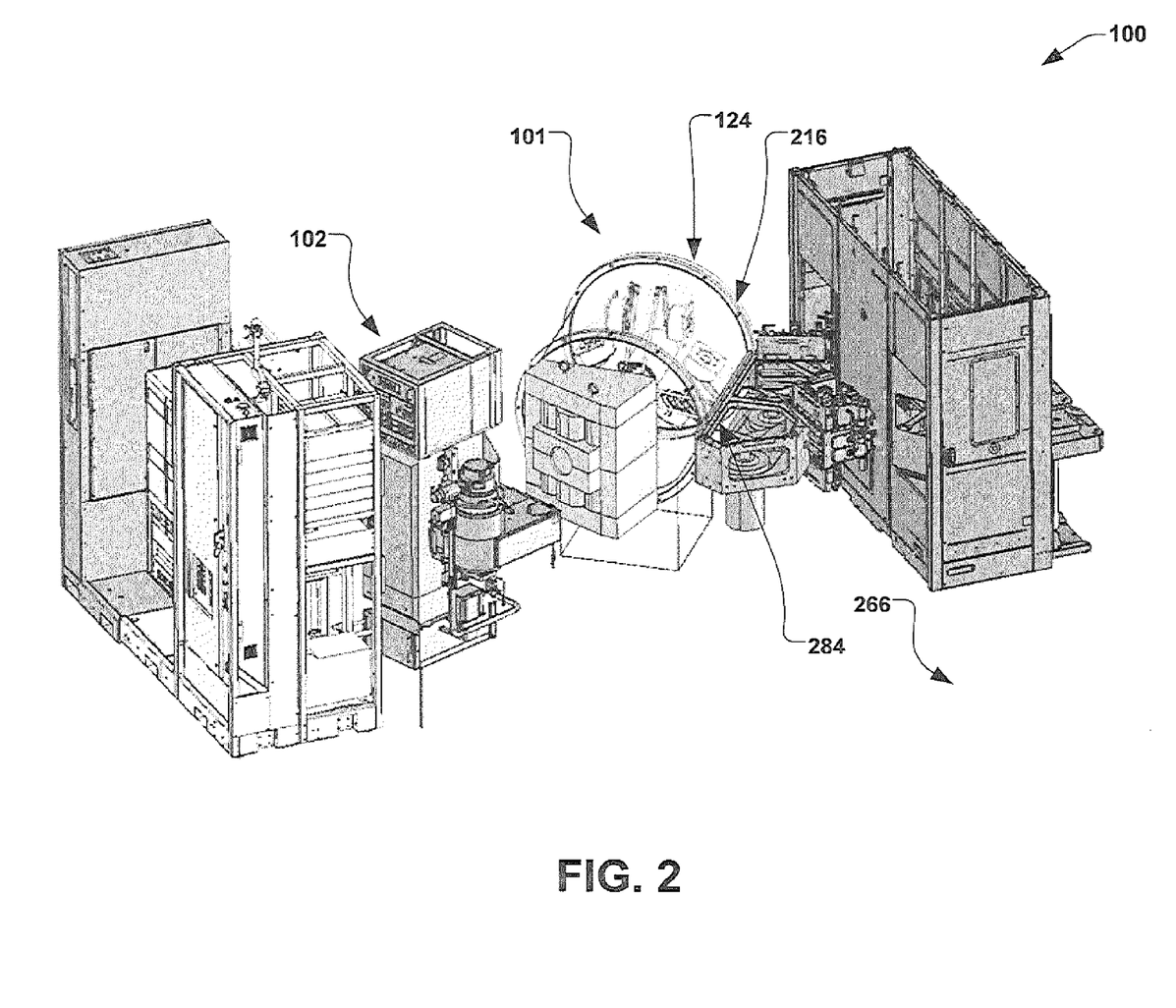
FIG. 2 is a perspective view of an exemplary ion implantation system according to another aspect of the invention.

The ion implantation system 100 further comprises a controller 130, wherein the controller is operable to control the ion implantation apparatus 101. For example, the controller 130 is operable to control the power source 108 for producing the ions, as well as the extraction power source 110, wherein the ion beam path P is generally controlled. The controller 130 is further operable to adjust the strength and orientation of the magnetic field associated with the mass analyzer 118, among other things. In another example, feedback from the deep faraday 128 is fed to the controller 128 to further control the ion implantation apparatus 101. The controller 130 is further configured to control the robotic architecture 126 for scanning of the workpiece 104 through the ion beam 103 and handling of the workpiece. It will be appreciated that the controller 128 may comprise a processor, computer system, and/or operator for overall control of the system 100 (e.g., a computer system in conjunction with input by an operator). FIG. 2 illustrates a perspective view of the exemplary ion implantation system 100 of FIG. 1.

Figure 3:
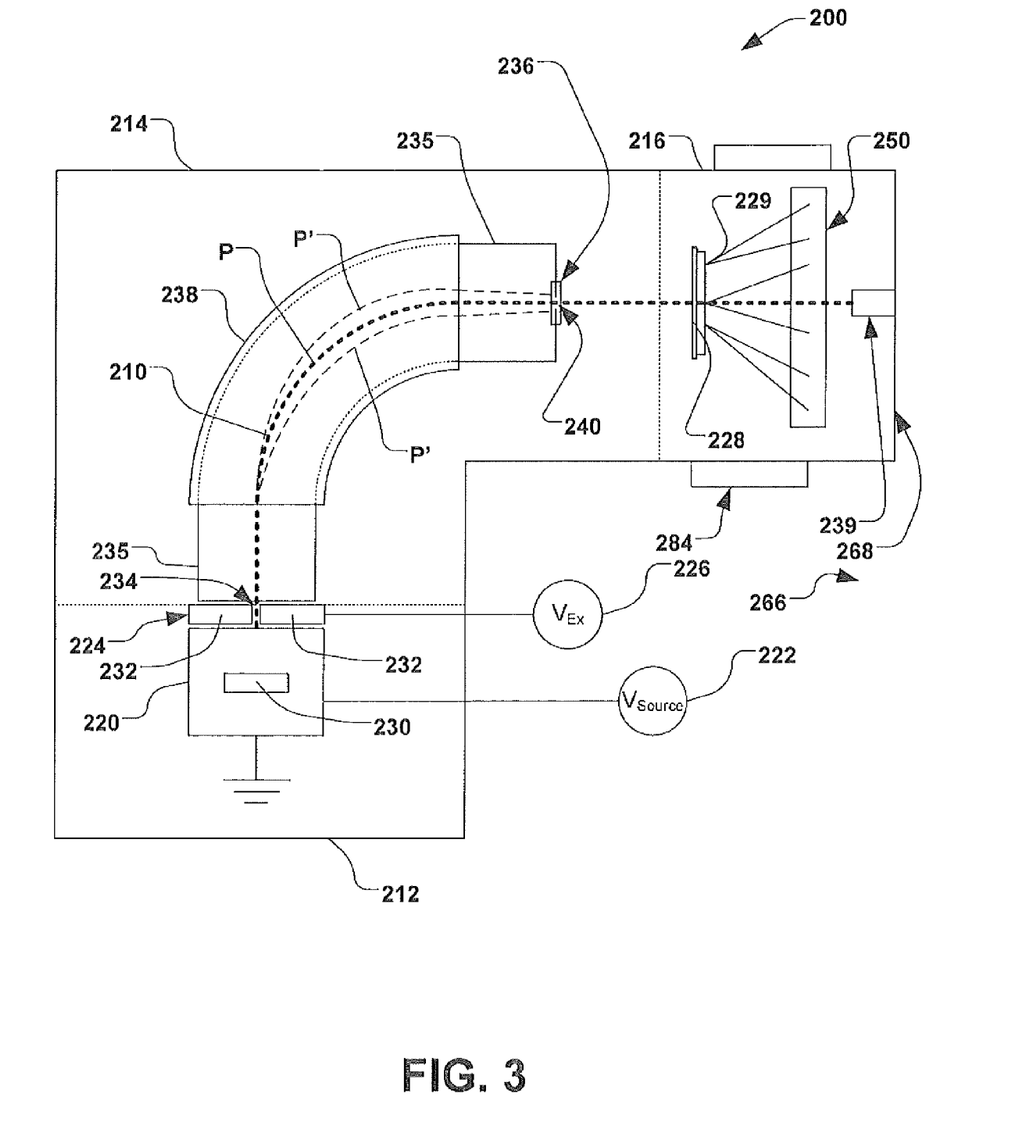
FIG. 3 is a plan view of an exemplary ion implantation apparatus according to another aspect of the present invention.

Referring now to FIG. 3, an exemplary ion implantation apparatus 200 is illustrated, such as the apparatus 101 in FIGS. 1 and 2, wherein the exemplary ion implantation apparatus is shown in greater detail. It should be again noted that although the ion implantation apparatus 200 is illustrated as one example, the present invention can be practiced using various other types of ion implantation apparatus and systems, such as high energy systems, low energy systems, or other implantation systems, and all such systems are contemplated as falling within the scope of the present invention.

The ion implantation system 200 of FIG. 3, for example, comprises a terminal 212, a beamline assembly 214, and an end station 216, wherein the terminal comprises an ion source 220 powered by a source power supply 222. The terminal 212 further comprises an extraction assembly 224 powered by an extraction power supply 226 to extract ions from the ion source 220 and thereby to provide the extracted ion beam 210 to the beamline assembly 214. The extraction assembly 224, in conjunction with the beamline assembly 214, for example, is operable to direct the ions toward a workpiece 228 residing on an end effector 229 in the end station 216 for implantation thereof at a given energy level.

In one example, the ion source 220 comprises a plasma chamber (not shown) wherein ions of a process gas or species are energized at a high positive potential $V_{source}$. It should be noted that generally, positive ions are generated, although the present invention is also applicable to systems wherein negative ions are generated by the source 220. The extraction assembly 224 further comprises a plasma electrode 230 and one or more extraction electrodes 232, wherein the plasma electrode is biased with respect to the one or more extraction electrodes, but floats with respect to the plasma within the ion source 220 (e.g., the plasma electrode at 120 kV with respect to the workpiece 228, wherein the workpiece is typically grounded). The one or more extraction electrodes 232, for example, are biased at a voltage less than that of the plasma electrode 230 (e.g., an extraction voltage $V_{Extract}$ of 0-100 kV). The negative relative potential at the one or more extraction electrodes 232 with respect to the plasma creates an electrostatic field operable to extract and accelerate the positive ions out of the ion source 220. For example, the one or more extraction electrodes 232 have one or more extraction apertures 234 associated therewith, wherein positively charged ions exit the ion source 220 through the one or more extraction apertures to form the ion beam 210, and wherein a velocity of the extracted ions is generally determined by the potential $V_{Extract}$ provided to the one or more extraction electrodes.

The beamline assembly 214, according to one aspect of the invention, comprises a beamguide 235 having an entrance near the ion source 220 (e.g., associated with the extraction aperture 234) and an exit with a resolving plate 236, as well as a mass analyzer 238 that receives the extracted ion beam 210 and creates a dipole magnetic field to pass only ions of appropriate charge-to-mass ratio or range thereof (e.g., a mass analyzed ion beam having ions of a desired mass range) to the workpiece 228 positioned in the end station 216. The ionization of source materials in the ion source 220 generates a species of positively charged ions having a desired atomic mass. However, in addition to the desired species of ions, the ionization process will also generate a proportion of ions having other atomic masses as well. Ions having an atomic mass above or below the proper atomic mass are not suitable for implantation and are referred to as undesirable species. The magnetic field generated by the mass analyzer 238 generally causes the ions in the ion beam 210 to move in a curved trajectory, and accordingly, the magnetic field is established such that only ions having an atomic mass equal to the atomic mass of the desired ion species traverse the beam path P to the end station 216.

Figure 6:
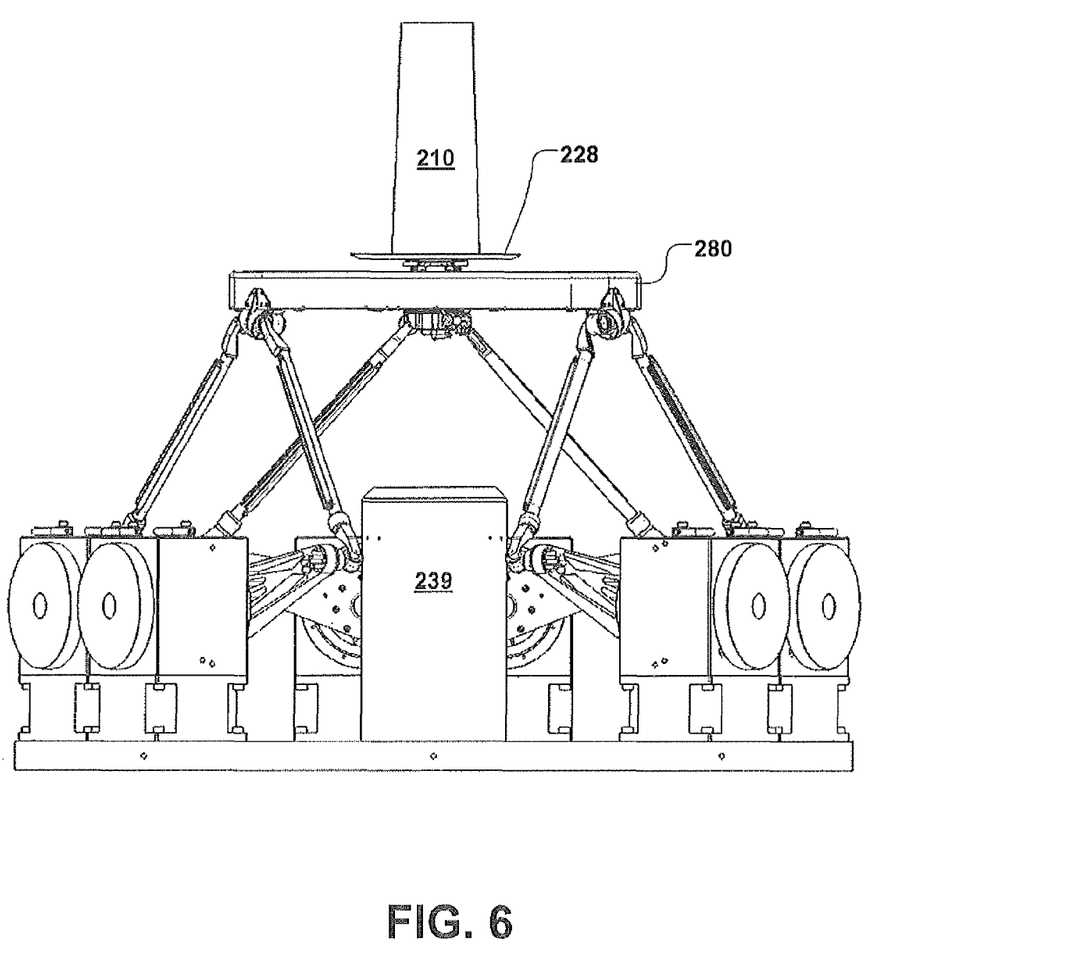
FIG. 6 illustrates a side view of the exemplary robotic apparatus and deep faraday of FIGS. 4 and 5 according to another aspect of the invention.
Figure 7:
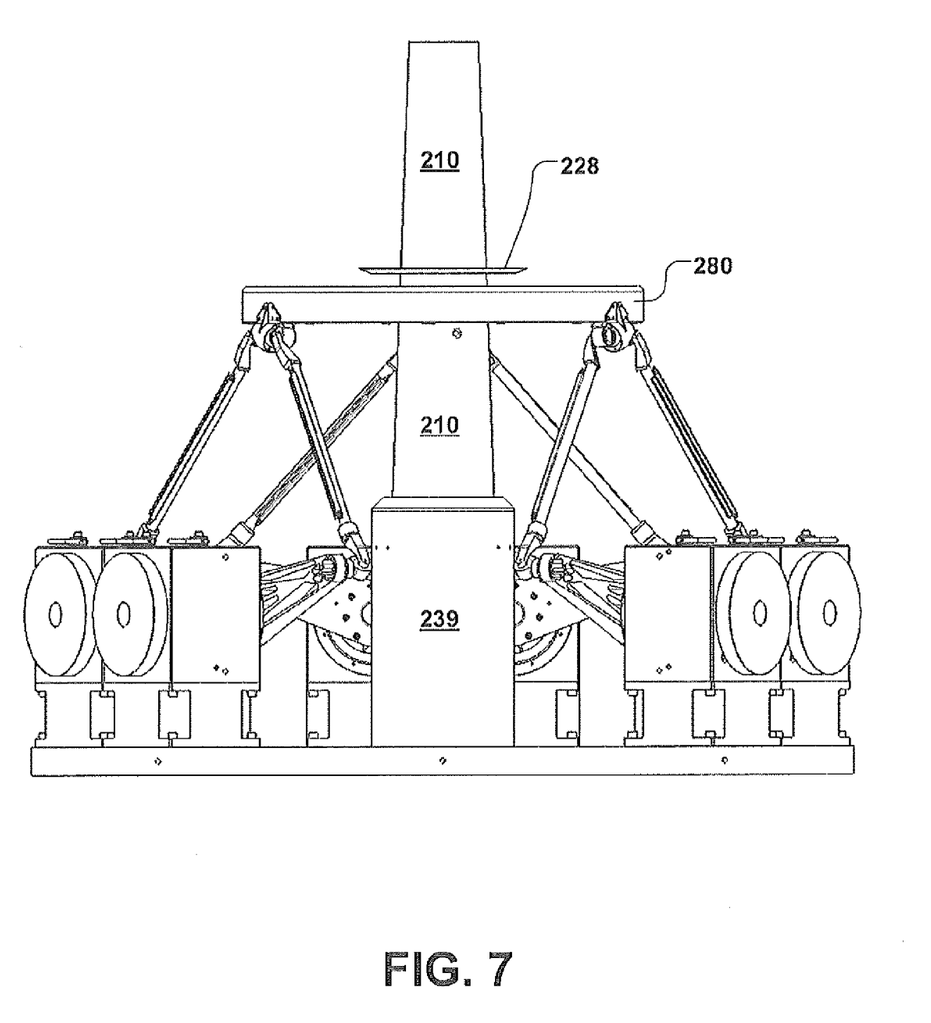
FIG. 7 illustrates another side view of the exemplary robotic apparatus and deep faraday of FIGS. 4-6 according to another aspect of the invention.

According to another exemplary aspect of the invention, the ion implantation apparatus 200 comprises deep faraday 239 coupled thereto, wherein the deep faraday is positioned along the path P of the ion beam 210 generally downstream of the workpiece 228, and is operable to intersect the path of the ion beam when the workpiece does not intersect the path, as illustrated in FIGS. 6 and 7. Accordingly, the deep faraday 239 is configured to measure characteristics of the ion beam and/or substantially confine the ion beam 210 within the end station 216 downstream of the workpiece. For example, the deep faraday 239 that can be operatively coupled the controller 128 of FIG. 1, wherein the controller is operable to determine whether characteristics of the ion beam are satisfactory for ion implantation. The deep faraday 239 of FIG. 4, for example, comprises a generally hollow cylinder lined with graphite, wherein the cylinder is substantially deep such that the ion beam is generally entrapped within the deep faraday, thus substantially decreasing particle contamination seen in conventional systems having shallow faradays.

In accordance with still another aspect of the invention, the resolving plate 236 at the exit of the beamguide 235 of FIG. 2 operates in conjunction with the mass analyzer 238 to eliminate undesirable ion species from the ion beam 210 which have an atomic mass close to, but not identical, to the atomic mass of the desired species of ions. The resolving plate 236, for example, is further comprised of vitreous graphite or another material such as tungsten or tantalum, and includes one or more elongated apertures 240, wherein the ions in the ion beam 210 pass through the aperture as they exit the beamguide 235. At the resolving plate 236, a dispersion of ions from the path P of the ion beam 210 (e.g., illustrated at P') is at its minimum value, wherein a width of the ion beam (P'-P') is at a minimum where the ion beam 210 passes through the resolving aperture 240.

In accordance with one exemplary aspect of the present invention, a robotic architecture 250 is provided for mechanically scanning workpieces or workpieces in multiple directions with respect to the ion beam 210 in order to optimize implant uniformity and minimize total implant time. The scanning comprises vector, raster, arcuate, and circular scan patterns singularly or in combination to produce optimum control over dose uniformity, implant time, and thermal management. In accordance with the invention, the robotic architecture is operable to provide at least four, and more preferably, six degrees of freedom for movement of the workpiece 228, with accelerations of less than 3 Gs, and further provides scalability to workpieces exceeding 450 mm in diameter.

FIGS. 4-7 illustrate various views and exemplary configurations of the robotic architecture 250 of the ion implantation system 200 of FIG. 3 in accordance with various aspects of the present invention. For example, various linkage assemblies 252 of FIG. 3 are provided to generally define the orientation and position of the end effector 229 with respect to the ion beam 210, therein allowing for a low inertia, yet mechanically stiff system. Thus, faster scanning speeds than previous two-axis mechanical scanning systems are provided without undesirable vibration-inducing impulses. Fast scanning speeds, for example, are generally desirable for throughput and uniformity considerations, thus the present invention provides a system for achieving such considerations.

The low inertia associated with the present invention generally eliminates counterbalances seen in other conventional systems, wherein the present invention provides minimal mechanical impulses at an industry-acceptable level. The present invention further provides flexibility for a scan of the workpiece 228 through the ion beam 210 in the plane of the workpiece, and also for angular implants where the workpiece is inclined to the scan direction, and both types of implant are possible with a scanning mechanism described infra. The present invention further permits simple rotary feed-throughs to be utilized to introduce the mechanical motion into the vacuum system. Alternatively, the drive motors and linkage assembles can be placed within the vacuum.

The scanning mechanism can comprise a Stewart Platform or a Delta robot, wherein multiple axes of motion produce a movement of the end effector. The Delta robot, for example, utilizes three sets of parallelogram-type linkages attached to a common end effector through various joints, wherein independent rotary motors produce motions in the X, Y, and Z directions. A Stewart Platform, for example, combines six linear actuators attached between a common base and the end effector, and is used to provide similar motion but with more degrees of freedom, for example the end effector may be moved in three perpendicular X, Y, and Z axes, as well as rotational yaw, pitch, and roll, thus covering six spatial dimensions or degrees of freedom.

The scanning mechanism of the present invention however, provides a novel robotic architecture to produce an extremely low inertia scanning system with the six spatial degrees of freedom, thus providing more freedom of movement than offered by the Stewart platform, while not having deleterious issues associated with linear actuators. The low inertia seen in the present invention derives from the types of links connecting the end effector to its motors. Six rotary motors fitted with six crank arms that are connected to six low mass link rods or struts, wherein the struts are connected at six different points on the end effector 229. The end effector 229 of the present invention is fully constrained by the linkage assemblies 252, thus allowing a full six degrees of freedom or motion.

Figure 4:
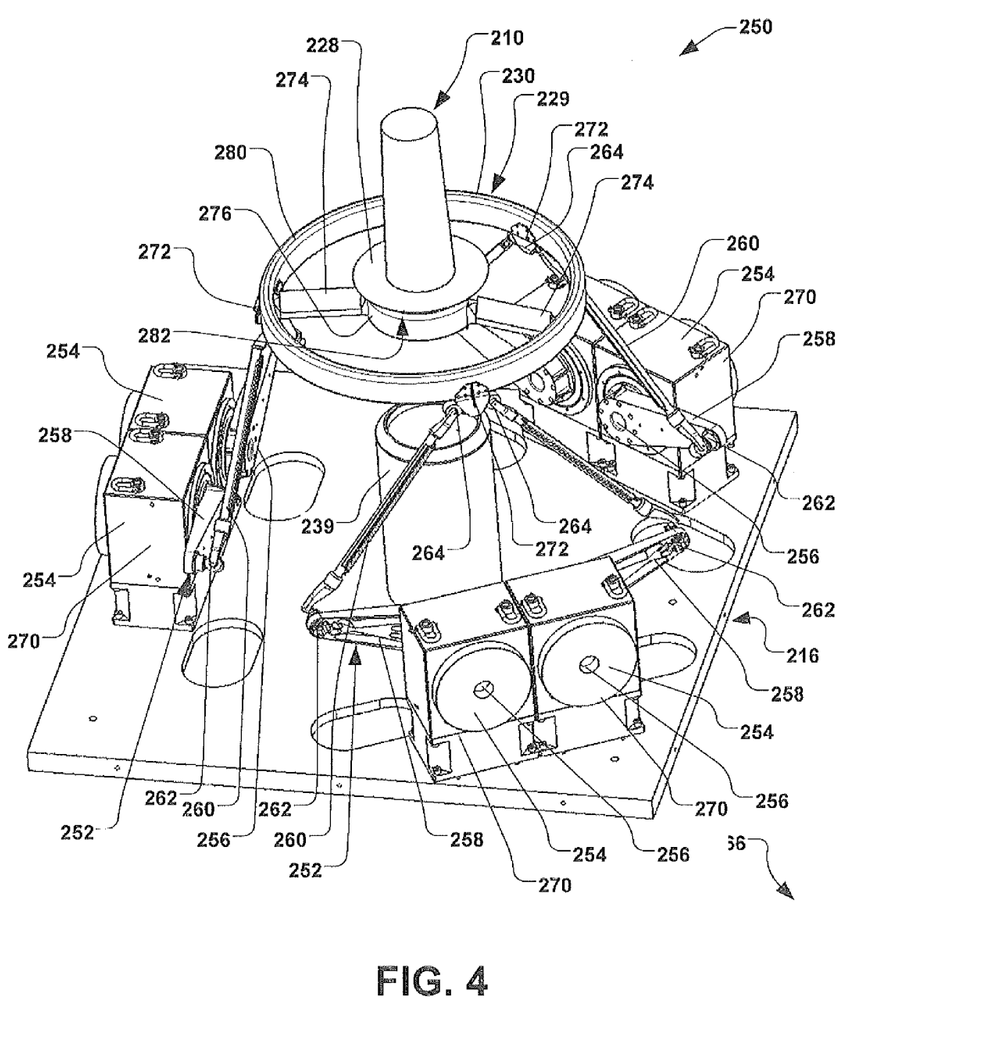
FIG. 4 is a perspective view an exemplary robotic apparatus associated with an ion beam according to an aspect of the invention.
Figure 5:
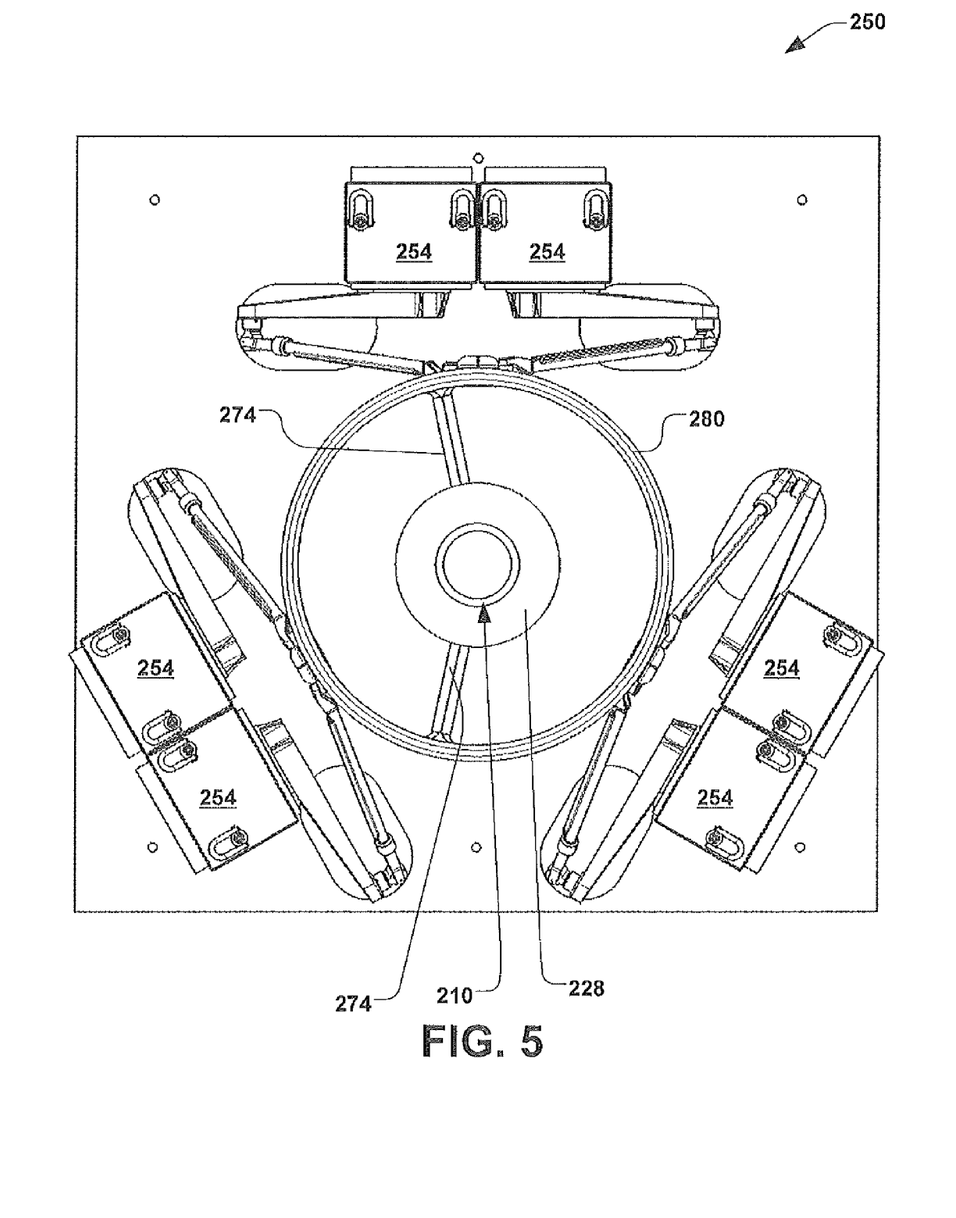
FIG. 5 is a plan view of the exemplary robotic apparatus of FIG. 4 illustrating a workpiece intersecting an ion beam according to another exemplary aspect of the invention.

In accordance with the present example, as illustrated in FIG. 4, the robotic architecture 250 comprises a plurality of motors 254 operatively coupled to the end station 216, wherein each of the plurality of motors has a rotational shaft 256 associated therewith. At least a portion of each rotational shaft 256 generally resides within the end station 216 of FIGS. 2 and 3, wherein each of the plurality of motors 254 has a linkage assembly 252 further respectively associated therewith. Each linkage assembly 252, for example, respectively comprises a crank arm 258 and a strut 260, wherein the crank arm of each linkage assembly is fixedly coupled to the respective rotational shaft 256. The strut 260 of each linkage assembly 252 is further pivotally coupled to the respective crank arm 258 at a respective first joint 262, wherein each strut is further pivotally coupled to the end effector 229 at a second joint 264.

In accordance with one example, the end station 216 is substantially sealed from an external environment 266, wherein the plurality of motors 254 fully resides within the end station 216 of FIG. 3. Alternatively, the shaft 256 of each of plurality of motors 254 of FIG. 4 passes through one or more walls 268 of the end station 216 of FIG. 3, wherein the remainder of each of the plurality of motors generally resides in the external environment 266. The plurality of motors 254, for example, may comprise high vacuum motors having integral cooling and vacuum seals (not shown). In a further example, the plurality of motors comprise a respective plurality of encoders (not shown), wherein a control of the plurality of motors is based on feedback from the plurality of encoders.

In one example, the plurality of motors 254 comprise six servo motors 270 respectively operatively coupled to six linkage assemblies 252, therein providing six degrees of freedom of movement of the end effector 229. Each of the first and second joints 262 and 264, for example, comprise gimbal, ball, and/or universal joints. The end effector 229, for example, comprises three pivot points 272, wherein two struts 260 are pivotally coupled to each pivot point, therein defining three pairs or servo motors 270 and linkage assemblies 252 that are associated the three respective pivot points of the end effector, as illustrated in FIGS. 4-8.

Figure 8:
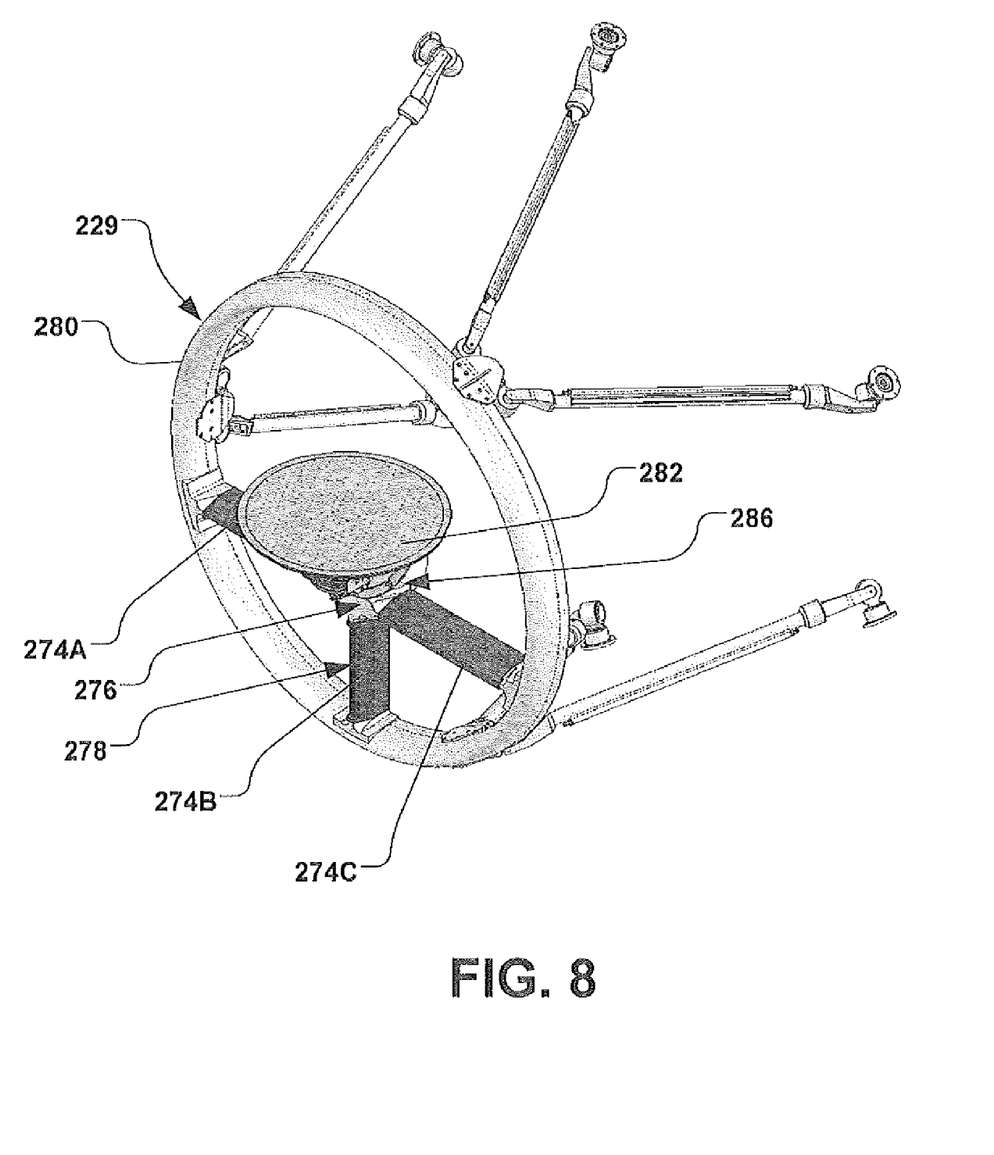
FIG. 8 is a partial perspective view of one exemplary end effector of another exemplary robotic apparatus in a transfer position according to yet another aspect of the invention.

The end effector 229 of FIGS. 4-8, in another example, comprises at plurality of spokes 274 emanating from a central structure 276. In FIGS. 4-7, for example, two spokes 274 emanate from the central structure 276, wherein the spokes emanate from the central structure at a predetermined angle with respect to one another. As illustrated in FIG. 8, for example, the end effector 229 comprises three spokes 274A-274C, wherein two of the three spokes 274A and 274B are generally perpendicular to one another, and wherein a long-slit faraday 278 is coupled to at least one of the two spokes that are generally perpendicular to one another. In one example, a long slit faraday 278 is provided on each of spokes 274A and 274B. Alternatively, one long-slit faraday 278 can be provided. The one or more long-slit faradays 278, for example, are operable determine one more characteristics of the ion beam illustrated in FIGS. 3 and 4 in-situ, by passing the one or more long-slit faradays through the ion beam 210 via a control of the robotic architecture 250. Further, a "wobble" of the end effector 229 can be achieved by control of the motors 254 in order to obtain ion beam angle data from the long-slit faraday 278. The "wobble" axes, for example, can be axes coplanar with the face of the appropriate long-slit faraday 278 and coaxial with the vertical centerline of the slit. Thus, a separate "scanning faraday" would not be needed for accurate characterization of the ion beam 210.

As illustrated in FIGS. 3-8, an arcuate structure 280 is further provided generally surrounding the central structure 276, wherein the three pivot points 272 are generally defined along the arcuate structure, and wherein the arcuate structure generally increases a stiffness of the end effector 229. The arcuate structure 280 may comprise an enclosed ring, as shown, or an open arc. One or more of the plurality of spokes 274, for example, are configured to carry one or more of the respective long-slit faradays 278, as described above. In another example, the three pivot points 272 are generally defined at an end of each spoke 274 (not shown), wherein no arcuate structure is provided (e.g., three spokes that are 120 degrees apart).

The plurality of spokes 274 and other components that may fall in line with the ion beam 210, for example, may further comprise one or more shields (not shown), wherein the shields generally prevent contamination from ion beam strikes.

In accordance with another aspect, one or more electrostatic chucks 282 are further provided (e.g., illustrated in at least FIG. 8), wherein the central structure 276 is configured to selectively engage and disengage each of the one or more electrostatic chucks. The ion implantation system of FIGS. 2 and 3, for example, further comprises an electrostatic chuck base station 284, wherein the one more electrostatic chucks 282 are configured to be heated and/or cooled at the electrostatic chuck base station, and wherein the central structure 276 of FIG. 4 is configured to selectively engage and disengage each of the electrostatic chucks at the electrostatic chuck base station. One or more portable faradays (not shown) may be further provided, wherein the central structure 276 is further configured to selectively engage and disengage the one or more portable faradays from the electrostatic chuck base station 284 of FIGS. 2 and 3 for selective translation through the ion beam 210 for characterization of the ion beam.

Exchange of electrostatic chucks 282 provides the ability to quickly and reasonably change between a hot and cold chuck surface. For example, the workpiece 228 of FIG. 4 is placed on a first ESC 282 in the vacuum environment or end station 216. The first ESC 282 can be maintained at a predetermined temperature, for example, prior to picking up the workpiece. Multiple ESCs 282 may be provided within the end station 216, such as four ESCs, wherein the temperature of each ESC is separately controlled. Each ESC 282, for example, resides on a cooling plate (associated with an electrostatic chuck base station—not shown) within the end station 216, wherein a seal is present around the cooling plate, and wherein the ESC is cooled in order to remove beam energy or heat caused by the ion beam. The cooling plate is sealed with the ESC 282, and a partial pressure gas can be further introduced to aid in cooling between the cooling plate and the ESC.

An algorithm is further provided for control of the motors 254 of FIGS. 4-8, wherein the controller 130 of FIG. 1 is operable to run all the motors simultaneously and keep them synchronized. A controlled path of the workpiece 228 is determined, and the control of the motors 254 is solved by reverse kinematics. Recovery from a glitch in the ion beam 210 is achieved by a seventh axis being provided in the control algorithm to act as a counter for keeping track of where the workpiece 228 and motor positions are when the glitch occurs, such that when a glitch occurs, the location is reproduced based on where the motors 254 were when the glitch occurred.

Figure 9A:
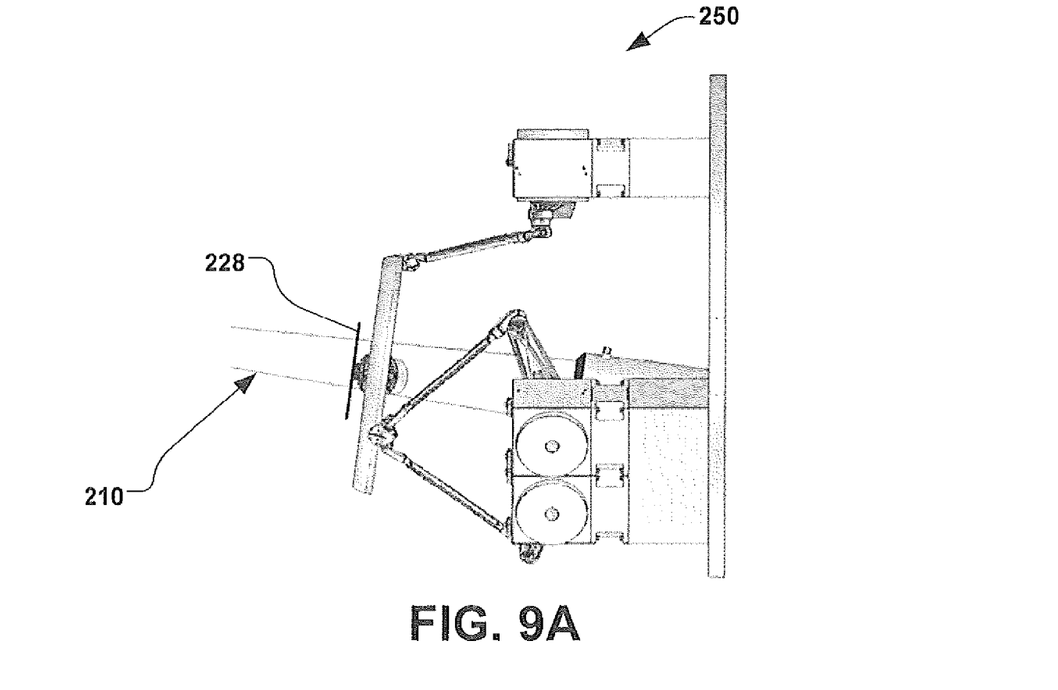
FIGS. 9A-9B illustrate various positions of the robotic apparatus for providing various angled implants according to another aspect of the invention.
Figure 9B:
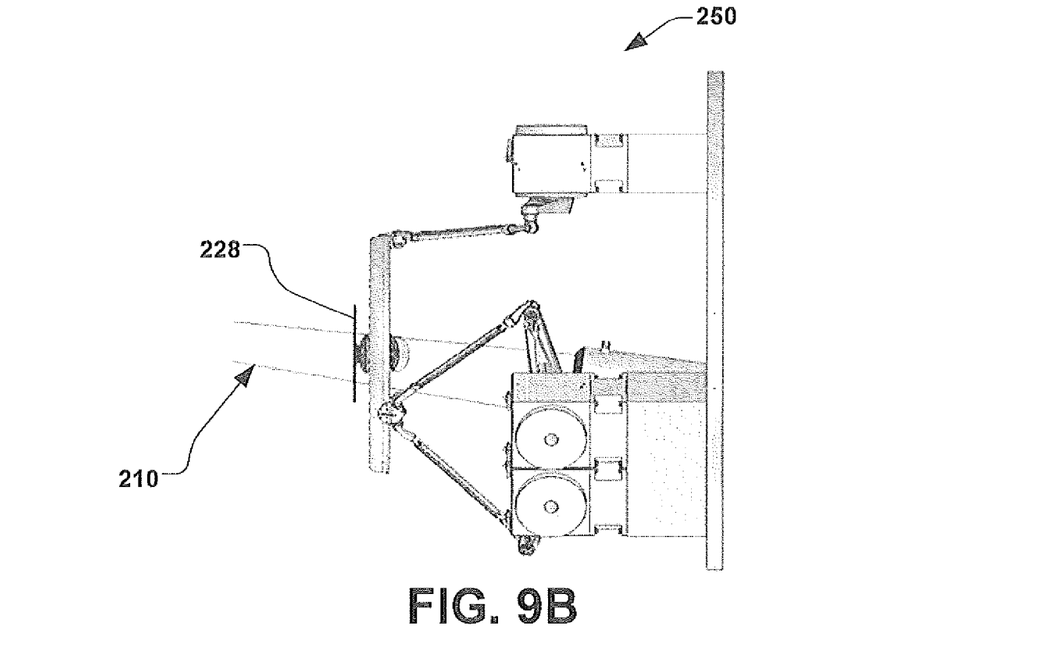

According to another exemplary aspect, the central structure 276 further comprises a pivot apparatus 286 illustrated again, in FIG. 8 wherein the pivot apparatus is configured to selectively rotate the electrostatic chuck 282 in one or more axes with respect to the central structure 276. The three pivot points 272 described above, and illustrated in FIG. 4, for example, generally define a plane of the central structure 276, and wherein the pivot apparatus 286 of FIG. 8 is configured to rotate each electrostatic chuck 282 along an axis that is generally parallel to the plane of the central structure. The pivot apparatus 286 may be further, or alternatively, configured to rotate the electrostatic chuck 282 along an axis that is generally perpendicular to the plane of the central structure 276. Such pivoting allows for variously angled implants, such as illustrated in FIGS. 9A and 9B, as well as workpiece handling, wherein the workpiece 228 can be picked and placed from and to a horizontal surface. For example, the pivot apparatus 286 provides the ability to rotate 90 degrees for quadrant implants. The motion of the pivot apparatus 286 can be utilized not only for quad implants, however, but also a continuous 360 degree rotation of the workpiece 228.

For example, the pivot apparatus 286 comprises a rotary motor coupled to the central structure 276 of the end effector 229, thus permitting the electrostatic chuck 282 to rotate with respect to the central structure. The pivot apparatus 286 can be utilized to rotate the ESC 282 in predetermined increments, or, alternatively, in a continuous rotation throughout the ion implantation. Rotation of the ESC 282 and workpiece 228 can be advantageous, as large step sizes can be attained between scans of the workpiece through the ion beam 210, thus reducing the number of scan lines, while maintaining uniformity. In other words, a spinning of the workpiece 228 superimposed on top of a coarse scan (e.g., on top of a raster scan, polygonal scan, or arcuate scan), can permit coarse steps in the scan to be made. Further, spinning of the workpiece provides greater uniformity that would otherwise have been lost by utilizing such coarser steps.

In accordance with another example, the end station 216 of FIGS. 2 and 3, for example, is substantially sealed from the external environment 266, wherein the plurality of motors 254 of FIG. 4 fully reside within a generally evacuated environment of the end station. Alternatively, the shafts 256 of plurality of motors 254 pass through one or more walls of the end station (not shown), wherein the remainder of each of the plurality of motors generally reside in the external environment 266. For example, a shaft seal (not shown), such as a ferro-fluidic seal, a differentially pumped seal, or a lip seal, can be implemented to pass the shafts 256 of the motors 254 through the one or more walls.

The plurality of motors 254, for example, comprise high vacuum servo motors having integral cooling and vacuum seals. In a further example, the plurality of motors 254 comprise a respective plurality of encoders (not shown), wherein a control of the plurality of motors is based on feedback from the plurality of encoders.

In accordance with another aspect, the controller 130 of the ion implantation system 100 of FIG. 1 is configured to control the robotic architecture 250 of FIG. 4, wherein the workpiece 228 is scanned through the ion beam 210 in a predetermined manner. For example, the controller 130 is configured to control the plurality of motors 254 based on feedback from the plurality of encoders (not shown), wherein one or more of the electrostatic chucks 282, workpieces 228, long-slit faradays 278, and portable faraday(s) (not shown) may be scanned through the ion beam 210.

Figure 10:
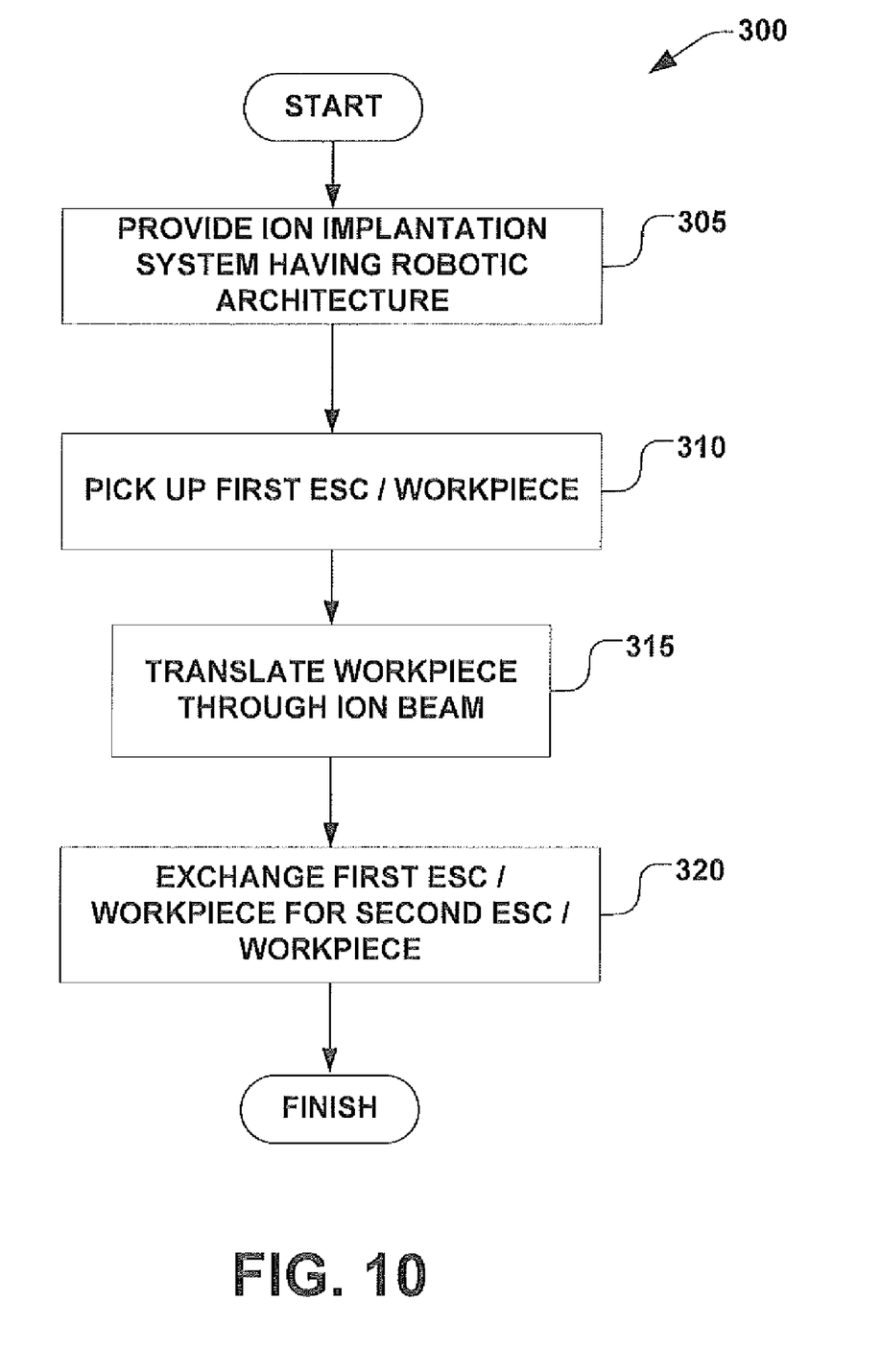
FIG. 10 is a block diagram of an exemplary method for an implantation of ions into one or more workpieces according to another exemplary aspect of the invention.

In accordance with yet another aspect, FIG. 10 illustrates an exemplary method 300 for implanting ions into a workpiece. While exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

As illustrated in FIG. 92, the method 300 begins with providing an ion implantation system and workpiece scanning system in act 305, wherein the ion implantation system and workpiece scanning system is configured to implant ions into the one or more workpieces via an ion beam, such as illustrated in any of FIGS. 1-91. In act 310, a first workpiece and/or first electrostatic chuck is gripped via the end effector, and a spatial position and orientation of the end effector (and first workpiece/ESC) with respect to the ion beam is controlled in act 315, wherein acts 310 and 315 are performed at least via a control of the plurality of motors. Thus, the workpiece can be scanned through the ion beam along a predetermined scan path. In act 320, the first workpiece and/or electrostatic chuck is/are exchanged for a second workpiece and/or electrostatic chuck, again under the control of the plurality of motors as described above, and the second workpiece is scanned through the ion beam in act 315.

The workpiece can be picked up and/or dropped off from a workpiece transfer point via the control of the motors in acts 310 and 320. In another example, one or more electrostatic chucks and/or a portable faraday can be selectively picked up and/or dropped off at the base station described above via the control of the motors in acts 310 and 320. The end effector can be further selectively scanned through the ion beam for profiling via selective translation of the above-described slot faraday(s) in act 315. According to another example, the control of the plurality of motors in acts 310-320 described above is based on feedback from the plurality of encoders.

The predetermined scan path, for example, comprises a plurality of generally polygonal scans of the ion beam when viewed from the plane of the workpiece. For example, a plurality of generally octagonal scans of the ion beam can be made when viewed from the plane of the workpiece. The predetermined scan path can further or alternatively comprise one or more of a plurality of vector, raster, circular, and arcuate scans of the ion beam when viewed from the plane of the workpiece.

The method 300, in accordance with another aspect of the invention, may comprise providing a plurality of electrostatic chucks, wherein each of the plurality of electrostatic chucks are operable to selectively grip the workpiece, and wherein the end effector comprises a central structure associated with the plurality of electrostatic chucks. One of the plurality electrostatic chucks is selectively engaged via the central structure. The workpiece, for example, can further be selectively engaged via the one of the plurality of electrostatic chucks, wherein the engagement of the workpiece can occur before, during, or after the engagement between the central structure and the electrostatic chuck.

According to another example, the method 300 further comprises heating and/or cooling the plurality of electrostatic chucks at the above-mentioned electrostatic chuck base station, wherein the central structure is configured to selectively engage and disengage one of the plurality of electrostatic chucks at the electrostatic chuck base station based on one or more of a desired processing temperature and a condition of each of the plurality of electrostatic chucks. The condition of each of the plurality of electrostatic chucks, for example, comprises a temperature of each of the plurality of electrostatic chucks.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. An ion implantation system, comprising:
    an ion source configured to form an ion beam;
    a mass analyzer configured to mass analyze the ion beam;
    an end station, wherein the end station comprises a robotic architecture having at least four degrees of freedom;
    one or more electrostatic chucks configured to selectively grip a workpiece; and
    an end effector operatively coupled to the robotic architecture, wherein the end effector comprises a central structure configured to selectively engage and disengage each of the one or more electrostatic chucks, and wherein the robotic architecture is configured to selectively translate the workpiece through the ion beam.

2. The ion implantation system of claim 1, wherein the robotic architecture comprises a modified Stewart platform.

3. The ion implantation system of claim 1, wherein the robotic architecture comprises a modified delta robot.

4. The ion implantation system of claim 1, wherein the robotic architecture comprises:
    a plurality of motors operatively coupled to the end station, wherein each of the plurality of motors has a rotational shaft associated therewith, wherein at least a portion of each rotational shaft generally resides within the end station, and wherein each of the plurality of motors has a linkage assembly respectively associated therewith, wherein each linkage assembly respectively comprises a crank arm and a strut, wherein the crank arm of each linkage assembly is fixedly coupled to the respective rotational shaft, and wherein the strut of each linkage assembly is pivotally coupled to the respective crank arm at a first joint, and pivotally coupled to the end effector at a second joint.

5. The ion implantation system of claim 4, wherein the plurality of motors is comprised of six servo motors operatively coupled to six linkage assemblies, therein providing six degrees of freedom of movement of the end effector.

6. The ion implantation system of claim 5, wherein the end effector comprises three pivot points, wherein two struts are pivotally coupled to each pivot point.

7. The ion implantation system of claim 6, wherein the end effector comprises three spokes emanating from a central structure, and wherein the three pivot points are generally defined at an end of each spoke.

8. The ion implantation system of claim 7, wherein two of the three spokes are generally perpendicular to one another.

9. The ion implantation system of claim 8, further comprising two long-slit faradays, wherein the two long-slit faradays are respectively coupled to the two of the three spokes that are generally perpendicular to one another.

10. The ion implantation system of claim 6, wherein the end effector comprises:
    a plurality of spokes emanating from a central structure; and
    an arcuate structure generally surrounding the central structure, wherein the three pivot points are generally defined along the arcuate structure, wherein the arcuate structure generally increases a stiffness of the end effector.

11. The ion implantation system of claim 10, wherein the arcuate structure comprises an enclosed ring.

12. The ion implantation system of claim 10, wherein the plurality of spokes is comprised of three spokes, wherein two of the three spokes are generally perpendicular to one another.

13. The ion implantation system of claim 12, further comprising two long-slit faradays, wherein the two long-slit faradays are respectively coupled to the two of the three spokes that are generally perpendicular to one another.

14. The ion implantation system of claim 4, wherein the end station is substantially sealed from an external environment, and wherein the plurality of motors fully reside within the end station.

15. The ion implantation system of claim 14, wherein the plurality of motors comprise high vacuum motors having integral cooling and vacuum seals.

16. The ion implantation system of claim 4, wherein the plurality of motors comprise a respective plurality of encoders, wherein a control of the plurality of motors is based on feedback from the plurality of encoders.

17. The ion implantation system of claim 1, further comprising an electrostatic chuck base station, wherein the one more electrostatic chucks are configured to be heated and/or cooled at the electrostatic chuck base station, and wherein the central structure is configured to selectively engage and disengage each of the electrostatic chucks at the electrostatic chuck base station.

18. The ion implantation system of claim 1, wherein the central structure further comprises a pivot apparatus, wherein the pivot apparatus is configured to selectively rotate the one or more electrostatic chucks in one or more axes.

19. The ion implantation system of claim 18, wherein the three pivot points generally defines a plane of the central structure, and wherein the pivot apparatus is configured to rotate the one or more electrostatic chucks along an axis that is generally parallel to the plane of the central structure.

20. The ion implantation system of claim 18, wherein the three pivot points generally defines a plane of the central structure, and wherein the pivot apparatus is configured to rotate the one or more electrostatic chucks along an axis that is generally perpendicular to the plane of the central structure.

21. The ion implantation system of claim 18, wherein the pivot apparatus is configured to rotate the one or more electrostatic chucks along one or more axes with respect to the central structure.

22. The ion implantation system of claim 1, wherein the end station further comprises a generally hollow cylindrical beam dump positioned along a path of the ion beam generally downstream of the workpiece, wherein the beam dump is configured to generally confine particulate contamination to within the beam dump.

23. The ion implantation system of claim 22, wherein the beam dump comprises a cylindrical faraday.

24. The ion implantation system of claim 22, wherein an interior surface of the beam dump is comprised of graphite.

25. The ion implantation system of claim 1, further comprising a controller configured to control the robotic architecture, wherein the workpiece is scanned through the ion beam in a predetermined manner.

26. A workpiece scanning system for scanning a workpiece through an ion beam, the workpiece scanning system comprising:
a process chamber associated with the ion beam;
a plurality of motors operably coupled to the process chamber, wherein each of the plurality of motors has a rotational shaft associated therewith, wherein at least a portion of each rotational shaft generally resides within the process chamber;
a linkage assembly associated with each of the plurality of motors, wherein each linkage assembly respectively comprises a crank arm fixedly coupled to the at least a portion of the rotational shaft and a strut pivotally coupled to the crank arm;
an end effector operably coupled to the strut of each linkage assembly;
a plurality of electrostatic chucks, wherein each of the plurality of electrostatic chucks is operable to support the workpiece thereon;
an electrostatic chuck base station, wherein the end effector comprises a central structure configured to selectively engage and disengage each of the plurality of electrostatic chucks from the electrostatic chuck base station, and
a controller operable to control the position of the workpiece with respect to the ion beam via a control of the plurality of motors.

27. The workpiece scanning system of claim 26, wherein the plurality of electrostatic chucks are configured to be heated and/or cooled at the electrostatic chuck base station.

28. The workpiece scanning system of claim 26, wherein the electrostatic chuck base station is configured to selectively heat or cool each of the plurality of electrostatic chucks.

29. A method for implanting ions into a workpiece, the method comprising:
providing an ion beam;
providing a workpiece scanning system comprising a plurality of motors operatively coupled to an end station, wherein each of the plurality of motors has a rotational shaft associated therewith, wherein at least a portion of each rotational shaft generally resides within the end station, and wherein each of the plurality of motors has a linkage assembly respectively associated therewith, wherein each linkage assembly respectively comprises a crank arm and a strut, wherein the crank arm of each linkage assembly is fixedly coupled to the respective rotational shaft, and wherein the strut of each linkage assembly is pivotally coupled to the respective crank arm at a first joint, and wherein each strut is further pivotally coupled to an end effector at a second joint;
providing a plurality of electrostatic chucks, wherein each of the plurality of electrostatic chucks are operable to selectively grip the workpiece, and wherein the end effector comprises a central structure associated with the plurality of electrostatic chucks;
selectively engaging one of the plurality electrostatic chucks via the central structure;
selectively engaging the workpiece via the one of the plurality of electrostatic chucks;
gripping the workpiece via the end effector; and
controlling a spatial position and orientation of the end effector and workpiece with respect to the ion beam via a control of the plurality of motors, wherein the workpiece is scanned through the ion beam along a predetermined scan path.

30. The method of claim 29, wherein the predetermined scan path comprises a plurality of generally polygonal scans of the ion beam when viewed from the plane of the workpiece.

31. The method of claim 29, wherein the predetermined scan path comprises a plurality of generally octagonal scans of the ion beam when viewed from the plane of the workpiece.

32. The method of claim 29, wherein the predetermined scan path comprises one or more of a plurality of vector, raster, arcuate, and circular scans of the ion beam when viewed from the plane of the workpiece.

33. The method of claim 29, wherein the plurality of motors comprise a respective plurality of encoders, wherein the control of the plurality of motors is based on feedback from the plurality of encoders.

34. The method of claim 29, further comprising heating and/or cooling the plurality of electrostatic chucks at an electrostatic chuck base station, wherein the central structure is configured to selectively engage and disengage one of the plurality of electrostatic chucks at the electrostatic chuck base station based on one or more of a desired processing temperature and a condition of each of the plurality of electrostatic chucks.

35. The method of claim 34, wherein the condition of each of the plurality of electrostatic chucks comprises a temperature of each of the plurality of electrostatic chucks.

* * * * *